United States Patent
Scholz et al.

(10) Patent No.: US 10,374,121 B2
(45) Date of Patent: Aug. 6, 2019

(54) OPTOELECTRONIC SEMICONDUCTOR COMPONENT AND METHOD FOR PRODUCING AN OPTOELECTRONIC SEMICONDUCTOR COMPONENT

(71) Applicant: OSRAM Opto Semiconductors GmbH, Regensburg (DE)

(72) Inventors: Dominik Scholz, Bad Abbach (DE); Alexander F. Pfeuffer, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/774,960

(22) PCT Filed: Nov. 9, 2016

(86) PCT No.: PCT/EP2016/077149
§ 371 (c)(1),
(2) Date: May 9, 2018

(87) PCT Pub. No.: WO2017/081085
PCT Pub. Date: May 18, 2017

(65) Prior Publication Data
US 2018/0331251 A1 Nov. 15, 2018

(30) Foreign Application Priority Data
Nov. 10, 2015 (DE) .................... 10 2015 119 353

(51) Int. Cl.
*H01L 33/00* (2010.01)
*H01L 27/15* (2006.01)
(Continued)

(52) U.S. Cl.
CPC ........ *H01L 33/0075* (2013.01); *H01L 27/153* (2013.01); *H01L 33/382* (2013.01);
(Continued)

(58) Field of Classification Search
CPC . H01L 33/0075; H01L 33/405; H01L 33/382; H01L 2933/0016; H01L 33/42; H01L 27/153
(Continued)

(56) References Cited

U.S. PATENT DOCUMENTS 8,772,806 B2   7/2014  Hwang et al.
9,196,653 B2  11/2015  Leatherdale et al.
(Continued)

FOREIGN PATENT DOCUMENTS

DE  102011056888 A1  6/2013
DE  102012107921 A1  3/2014
(Continued)

*Primary Examiner* — Jasmine J Clark
(74) *Attorney, Agent, or Firm* — Slater Matsil, LLP

(57) ABSTRACT

An optoelectronic semiconductor component and a method for producing an optoelectronic semiconductor component are disclosed. In an embodiment, a component includes a semiconductor layer sequence including a first main side, a first layer, an active layer, a second layer and a second main side, a first contact element arranged on the second main side filling a recess in the semiconductor layer sequence, wherein the recess extends from the second main side through the second layer and the active layer and opens out into the first layer and a second contact element arranged on the second main side, the second contact element being arranged laterally next to the recess in a plan view of the second main side, wherein the first contact element comprises a first transparent intermediate layer, a metallic first mirror layer and a metallic injection element.

21 Claims, 12 Drawing Sheets

(51) Int. Cl.
*H01L 33/38* (2010.01)
*H01L 33/40* (2010.01)
*H01L 33/42* (2010.01)

(52) U.S. Cl.
CPC ............ *H01L 33/405* (2013.01); *H01L 33/42* (2013.01); *H01L 2933/0016* (2013.01)

(58) Field of Classification Search
USPC .......................................................... 257/99
See application file for complete search history.

(56) References Cited

U.S. PATENT DOCUMENTS

| | | | |
|---|---|---|---|
| 9,362,335 | B2 | 6/2016 | von Malm |
| 9,685,591 | B2 | 6/2017 | Otto |
| 9,899,418 | B2 | 2/2018 | Pfeuffer et al. |
| 2009/0283787 | A1 | 11/2009 | Donofrio et al. |
| 2010/0124246 | A1* | 5/2010 | Lutgen ................ H01L 33/0095 372/50.1 |
| 2012/0138969 | A1 | 6/2012 | Moon et al. |
| 2014/0014894 | A1 | 1/2014 | Mohammed et al. |
| 2015/0255692 | A1 | 9/2015 | Pfeuffer |
| 2016/0027765 | A1 | 1/2016 | von Malm et al. |
| 2016/0300829 | A1 | 10/2016 | Leirer et al. |
| 2017/0186911 | A1 | 6/2017 | Otto et al. |

FOREIGN PATENT DOCUMENTS

| | | |
|---|---|---|
| DE | 102012112302 A1 | 6/2014 |
| DE | 102013102667 A1 | 10/2014 |
| DE | 102013112881 A1 | 5/2015 |
| DE | 102014101896 A1 | 8/2015 |
| DE | 102014112750 A1 | 3/2016 |
| DE | 102015108532 A1 | 12/2016 |
| DE | 102015116865 A1 | 4/2017 |
| EP | 2472611 A2 | 7/2012 |
| JP | 2011187958 A | 9/2011 |
| JP | 2013501357 A | 1/2013 |
| JP | 2015501085 A | 1/2015 |
| JP | 2015177087 A | 10/2015 |
| WO | 2014033041 | 3/2014 |

* cited by examiner

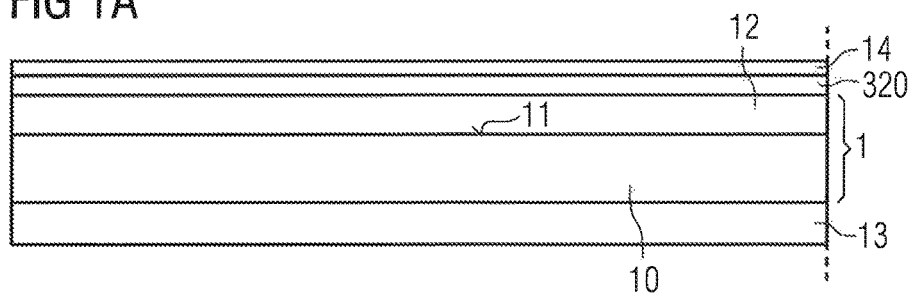
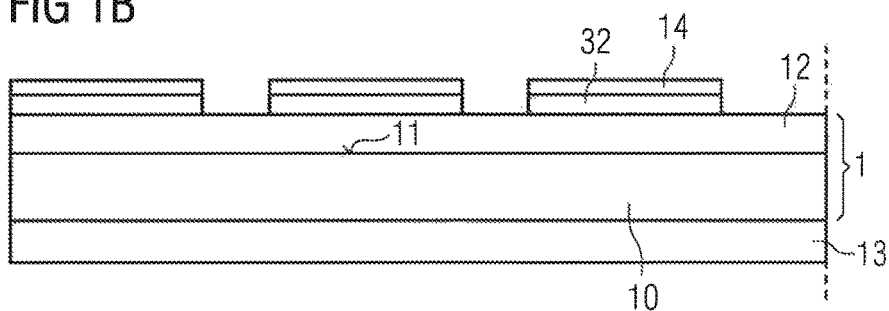
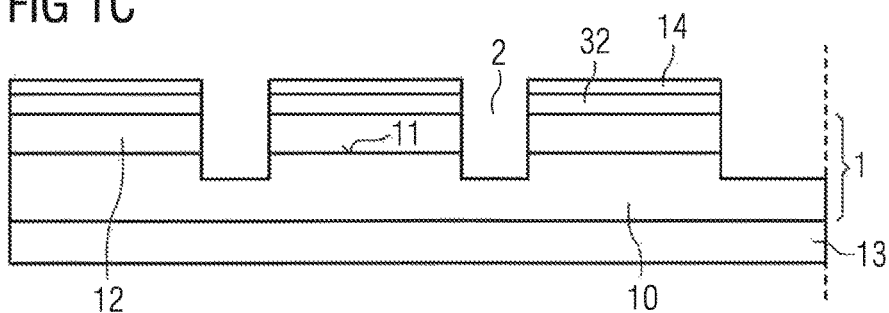

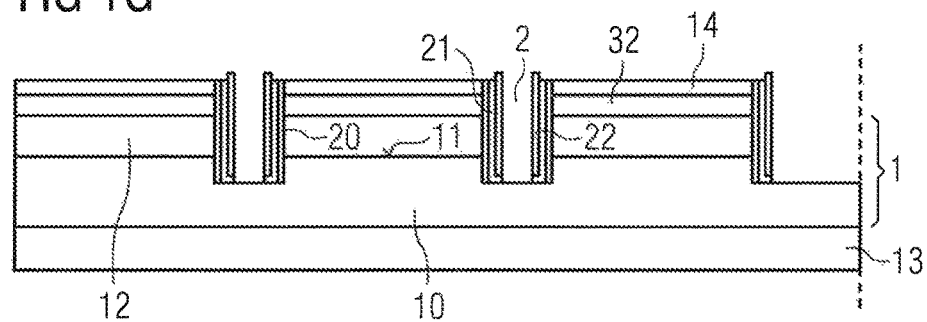
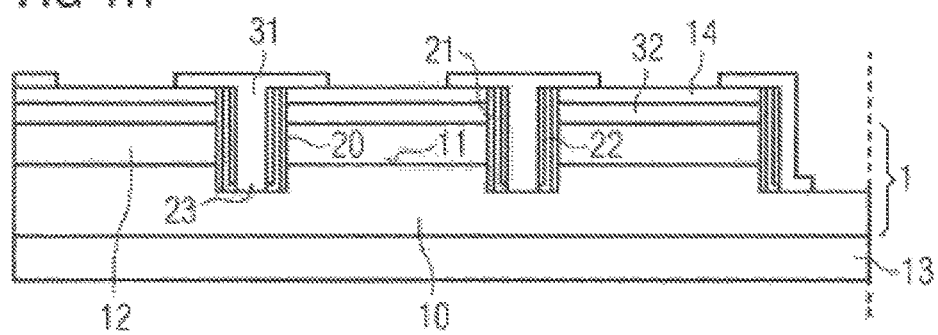
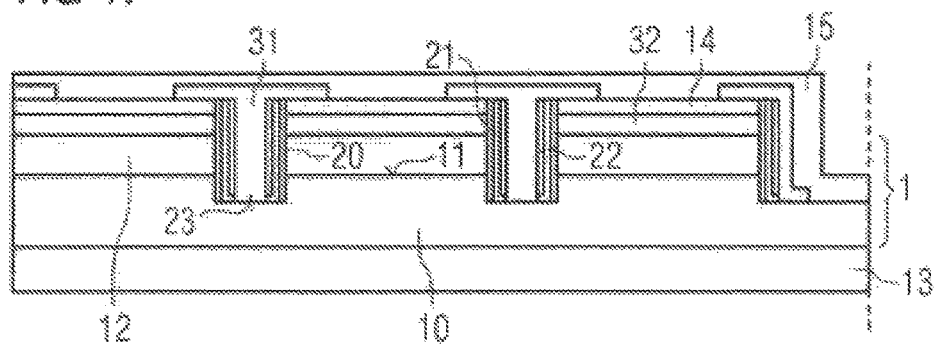

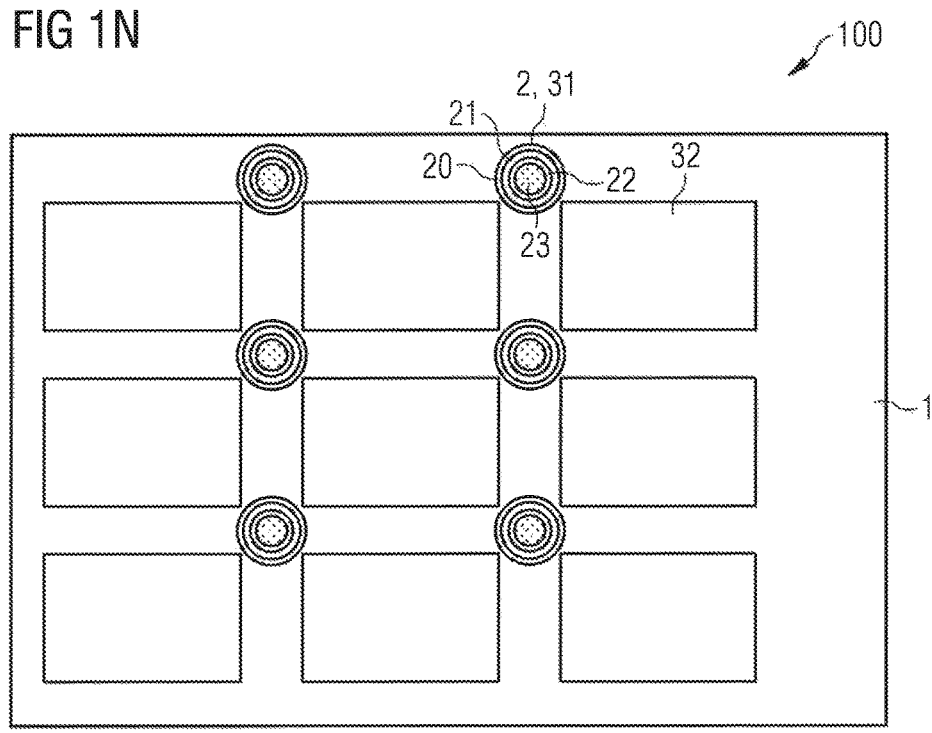

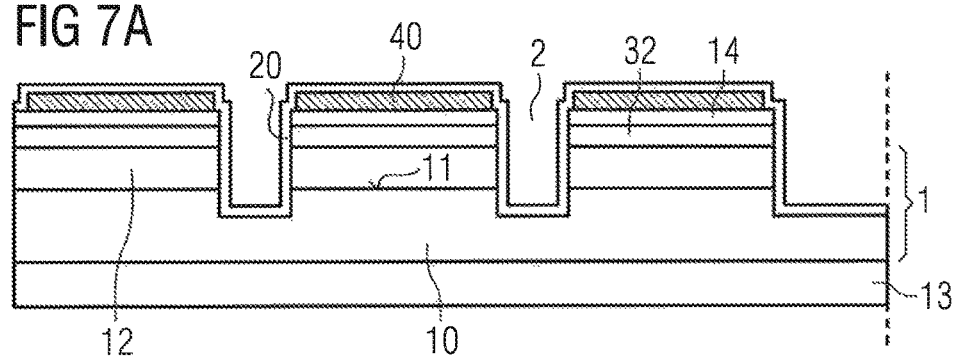
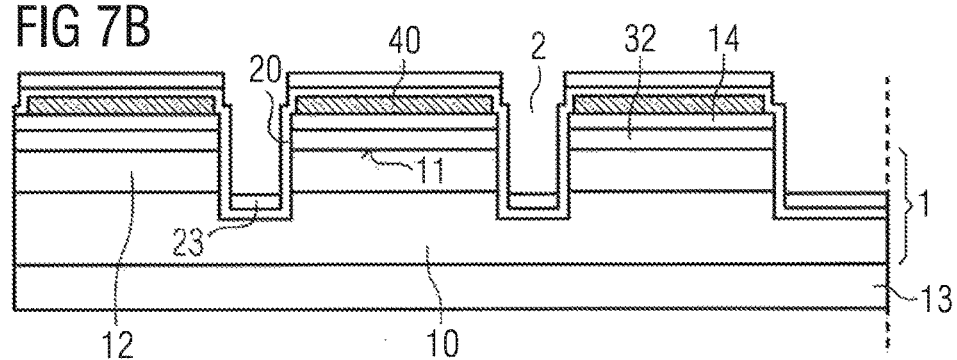
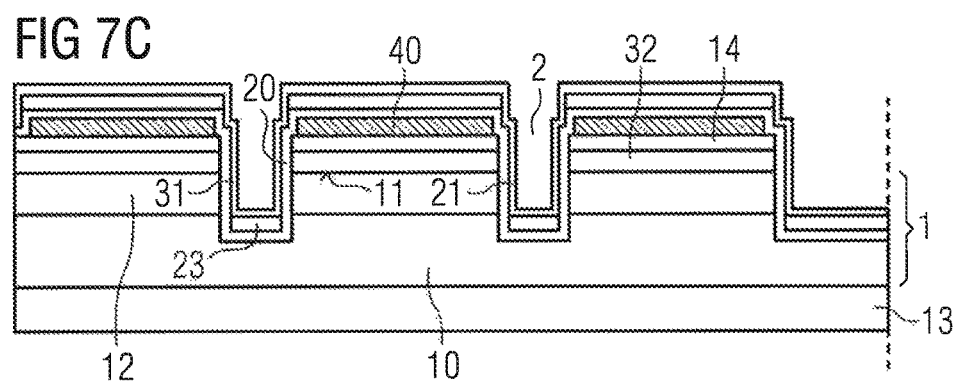
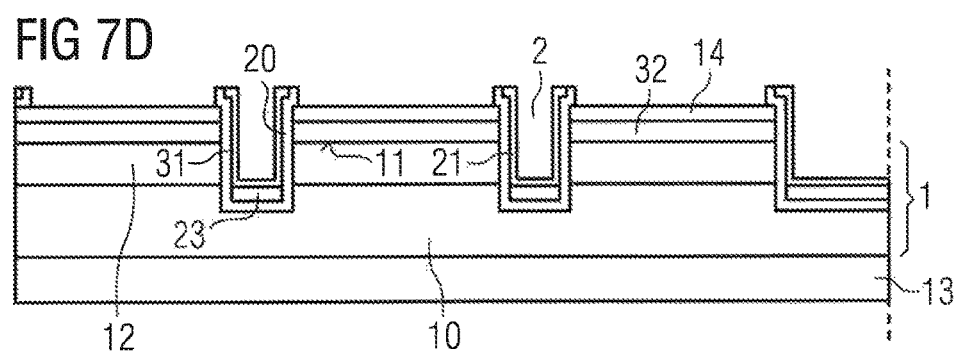

OPTOELECTRONIC SEMICONDUCTOR COMPONENT AND METHOD FOR PRODUCING AN OPTOELECTRONIC SEMICONDUCTOR COMPONENT

This patent application is a national phase filing under section 371 of PCT/EP2016/077149, filed Nov. 9, 2016, which claims the priority of German patent application 10 2015 119 353.1, Nov. 10, 2015, each of which is incorporated herein by reference in its entirety.

TECHNICAL FIELD

The invention relates to an optoelectronic semiconductor component. The invention further relates to a method for producing an optoelectronic semiconductor component.

SUMMARY OF THE INVENTION

Embodiments provide an optoelectronic semiconductor component having a pixelated luminous surface. In various embodiments the individual image points or pixels of the luminous surface are intended to be particularly rich in contrast, that is to say sharply separated from one another for an observer. Further embodiments provide a method for producing such a semiconductor component.

According to at least one embodiment, the optoelectronic semiconductor component comprises a semiconductor layer sequence. The semiconductor layer sequence has the following elements arranged one above the other in the specified sequence: a first main side, a first layer, an active layer, a second layer and a second main side. The active layer extends, for example, substantially parallel to the first and/or second main side. The first and the second layer are preferably semiconductor layers and may, for example, each have a plurality of individual semiconductor layers. For example, the first layer directly adjoins the first main side and the active layer. The second layer preferably directly adjoins the active layer and the second main side. The first layer is, for example, an n-doped layer, and the second layer is a p-doped layer. However, opposite doping is also possible in each case.

The semiconductor layer sequence is based, for example, on a III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$, or also an arsenide compound semiconductor material, such as $Al_nIn_{1-n-m}Ga_mAs$, wherein in each case $0 \leq n \leq 1$, $0 \leq m \leq 1$ and $m+n \leq 1$. In this case, the semiconductor layer sequence may have dopants and additional constituents. For the sake of simplicity, however, only the essential components of the crystal lattice of the semiconductor layer sequence are specified, i.e., Al, As, Ga, In, N or P, even if these components may be partially replaced and/or supplemented by small quantities of further substances. The semiconductor layer sequence is preferably based on AlInGaN.

The active layer has, for example, at least one p-n junction and/or a quantum well structure in the form of a single quantum well, SQW for short, or in the form of a multi-quantum well structure, MQW for short.

According to at least one embodiment, the semiconductor component has a first contact element arranged on the second main side. The first contact element has, for example, a metal or consists thereof. In this case, the first contact element serves for contacting the semiconductor layer sequence, in particular the first layer, during operation.

The first contact element preferably fills a recess in the semiconductor layer sequence completely or partially. In particular, the first contact element may be a coating in the recess, which contours and completely covers the inner sides of the recess. The recess extends from the second main side completely through the second layer and the active layer and opens into the first layer. A bottom surface of the recess extending parallel or substantially parallel to the active layer may be formed in the first layer.

The recess may, for example, form a through-connection, such as a cylindrical through-connection, in the semiconductor layer sequence. The bottom surface of the cylinder is then formed in the first layer.

According to at least one embodiment, a second contact element is applied to the second main side of the semiconductor layer sequence. The second contact element is arranged laterally next to the recess in a plan view of the second main side and has, for example, a rectangular or square basic shape in plan view. The lateral direction is here and in the following a direction parallel to the second main side and/or to the main extension direction of the active layer. The second contact element has, for example, a metal such as Al, Ag, Ti or consists thereof.

During operation, for example, second charge carriers are injected into the second layer of the semiconductor layer sequence via the second contact element. For this purpose, the second contact element is preferably in direct electrical and mechanical contact with the second layer.

The first contact element and the second contact element may be arranged next to one another and spaced apart from one another in a plan view of the main side. Alternatively, it is also possible that the first contact element and the second contact element at least partially overlap in plan view and are, for example, in the vertical direction, spaced apart from one another and isolated from one another by an insulating layer perpendicular to the lateral direction.

According to at least one embodiment, the first contact element has a first transparent intermediate layer, a metallic first mirror layer and a metallic injection element.

According to at least one embodiment, the first intermediate layer is applied to side walls of the recess extending transversely to the active layer and is in direct contact with the semiconductor layer sequence. The first intermediate layer is in particular transparent for radiation emitted by the active layer. For example, the transparency of the first intermediate layer at an average wavelength emitted by the active layer is at least 80% or at least 85% or at least 90% or at least 95%.

According to at least one embodiment, the first mirror layer is applied directly to the first intermediate layer in the region of the side walls. The first mirror layer has, for example, silver, aluminum or rhodium or consists thereof.

According to at least one embodiment, the injection element is applied to a bottom surface of the recess directly adjoining the first layer. No further metallic element, in particular no further reflecting element, is arranged between the injection element and the bottom surface. The first injection element has, for example, Al, Ag, Ti or consists thereof. In a plan view of the second main side, the injection element preferably covers at least 60% or at least 80% or at least 90% of the bottom surface of the recess.

Via the first contact element, for example, first charge carriers are injected through the recess into the first layer of the semiconductor layer sequence. On the way into the first layer, at least a part of the first charge carriers preferably passes through the injection element and passes from there into the first layer of the semiconductor layer sequence.

According to at least one embodiment, in the intended operation, the first intermediate layer prevents a direct current flow between the second layer and the first contact element. In other words, the first intermediate layer acts electrically insulating between the second layer and the first mirror layer. That is to say that, in this region, the first intermediate layer has no or does not have any significant current permeability in the case of an intended operating voltage applied to the semiconductor component. The same preferably applies in the region between the active layer and the first mirror layer. Between the first layer and the first mirror layer, the first intermediate layer may have an electrically insulating or current-conducting effect.

According to at least one embodiment, the contour of the second contact element defines the shape, size and position of an image point of the semiconductor component which is illuminated when looking onto the first main side during operation. For example, the shape of the image point when looking onto the first main side is thus determined by a projection of the second contact element onto the first main side. In this case, the shape and size of the image point does not necessarily correspond to 1:1 of the shape and size of the second contact element. In particular by lateral current expansion within the semiconductor layer sequence, the shape and size of the image point may deviate slightly from the shape and size of the second contact element, for example, by at most 10% or at most 5%.

According to at least one embodiment, the injection element and the mirror layer have different material compositions. In particular, the injection element and the mirror layer consist of different materials.

In at least one embodiment, the optoelectronic semiconductor component comprises a semiconductor layer sequence having a first main side, a first layer, an active layer, a second layer and a second main side, which are layered one on top of the other in the specified sequence. Furthermore, a first contact element, which fills a recess in the semiconductor layer sequence, is arranged on the second main side. The recess extends from the second main side completely through the second layer and the active layer and opens into the first layer. A second contact element is also arranged on the second main side, which is arranged laterally next to the recess in a plan view of the second main side. The first contact element comprises a first transparent intermediate layer, a metallic first mirror layer and a metallic injection element. The first intermediate layer is applied to side walls of the recess extending transversely to the active layer and is in direct contact with the semiconductor layer sequence. The first mirror layer is applied directly to the first intermediate layer in the region of the side walls. The injection element is applied to a bottom surface of the recess directly adjoining the first layer, wherein no further metallic element is arranged between the injection element and the bottom surface. During operation, the first intermediate layer prevents a direct current flow between the second layer and the first contact element. When looking at the first main side, the contour of the second contact element defines the shape, size and position of an image point of the semiconductor component that is illuminated during operation. The injection element and the mirror layer have different material compositions.

The invention described here is based in particular on the knowledge that a particularly high contrast ratio is desirable between two adjacent image points or pixels. If there is a plated-through hole between the two image points for making contact with the semiconductor layer sequence, this through-contact can thus contribute to the contrast increase between the two pixels. Light generated in the active layer may be reflected back by reflecting side walls of the plated-through hole, whereby an optical cross-talk of the adjacent pixels is suppressed. This effect is intensified by the fact that a material is less reflective at a bottom surface of the through-connection, in particular absorbing, for light from the image points. In a plan view, the through-connection then appears darker, so that the contrast ratio between two adjacent image points is increased.

Since the injection element and the first mirror layer have different materials, the mirror layer may be optimized for reflectivity, whereas the injection element may be optimized for electrical properties. Overall, both the brightness of individual image points or pixels as well as the pixel to pixel contrast ratio may be improved in this way.

According to at least one embodiment, the side walls of the recess are covered with the first mirror layer to at least 80% or at least 95%. The side walls are preferably completely covered with the first mirror layer.

According to at least one embodiment, the reflectivity of the first mirror layer at an average wavelength emitted by the active layer is at least 80% or at least 85% or at least 90% or at least 92% or at least 95%.

According to at least one embodiment, the reflectivity of the injection element at an average wavelength emitted by the active layer is at most 70% or at most 50% or at most 40% or at most 30% or at most 10%.

According to at least one embodiment, the injection element adjoins the first layer of the semiconductor layer sequence directly in the region of the bottom surface. In this way, the first charge carriers can be injected directly into the first layer from the injection element, without having to pass further materials or elements.

Alternatively, it is also possible that a transparent electrically conductive layer is formed between the injection element and the first layer in the region of the bottom surface. The transparent layer then directly adjoins the injection element on one side and directly adjoins the first layer on an opposite side. The transparent layer has, for example, a transparency at an average wavelength emitted by the active layer of at least 80% or at least 85% or at least 90% or at least 95%. In this case, the transparent layer may be a transparent conductive oxide, TCO for short, such as indium tin oxide, ITO for short, or ZnO or consist thereof. The thickness of the transparent conductive layer on the bottom surface is, for example, at least 5 nm or at least 20 nm or at least 50 nm or at least 100 nm and/or at most 500 nm or at most 200 nm or at most 100 nm.

According to at least one embodiment, the intermediate layer is a contact layer, wherein the contact layer produces an electrical contact between the first layer and the first mirror layer in the region of the first layer. In the region of the second layer, the contact layer acts substantially electrically insulating between the first mirror layer and the second layer. The contact layer is preferably not only applied to the side walls but is additionally arranged between the bottom surface and the injection element and is in direct contact with the bottom surface and the injection element, for example. In particular, the contact layer may be a continuous layer, such as simply connected layer, which contours all inner sides of the recess and preferably completely covers it.

A layer thickness of the contact layer is, for example, between 5 nm inclusive and 200 nm inclusive, preferably between 10 nm inclusive and 50 nm inclusive.

The contact layer in particular produces an electrical contact between the first layer of the semiconductor layer sequence and the first mirror layer and/or the injection element. In other words, the contact layer has a good electrical conductivity with respect to the first layer during operation of the semiconductor component. A contact resistance between the contact layer and the first layer may be, for example, at least $5 \cdot 10^{-6}$ $\Omega \cdot cm^2$ and at most $1 \cdot 10^4$ $\Omega \cdot cm^2$. When an operating voltage is applied, a current flow is thus made possible directly between the contact layer and the first layer.

On the other hand, the contact layer acts in an electrically insulating manner between the first mirror layer and the second layer, thus, the contact layer has, in particular, poor electrical conductivity with respect to the second layer. A contact resistance between the contact layer and the second layer may, for example, be several orders of magnitude higher than in the aforementioned case. For example, the contact resistance is then at least 10 to 100 times, in particular more than wo times, preferably more than 1000 times the aforementioned upper range limit, that is to say at least $1 \cdot 10^3$ $\Omega \cdot cm^2$. With regard to a functionality of the semiconductor device, a current flow between the contact layer and the second layer is substantially prevented.

In other words, the contact layer is a contact material, which selectively enters only a good electrical contact with the first layer. By way of example, the contact material, on the other hand, forms a blocking diode to the second layer during operation of the semiconductor component. Alternatively or additionally, the contact material forms a greatly increased ohmic contact resistance to the second layer during operation of the semiconductor component.

Materials which have such selective contact properties are, for example, transparent conductive oxides, TCO for short. Transparent conductive oxides are transparent conductive materials, generally metal oxides, such as, for example, indium tin oxide or zinc oxide.

In at least one embodiment, the contact layer has zinc oxide, such as ZnO, or consists thereof. The semiconductor layer sequence is based, for example, on gallium nitride, GaN for short. In an advantageous manner, zinc oxide behaves intrinsically as an n-semiconductor. Surprisingly, it has been found that this has a selectively good electrical contact with one n-conducting first layer based on gallium nitride, for short n-GaN, and forms a reverse-blocking diode, during operation of the semiconductor component, to a p-conductive second layer based on gallium nitride, for short p-GaN. In this case, a contact resistance between the contact layer and the first layer may be, for example, at least $5 \cdot 10^6$ $\Omega \cdot cm2$ and at most $5 \cdot 10^5$ $\Omega \cdot cm^2$. Furthermore, a contact resistance between the contact layer and the second layer may be at least $5 \cdot 10^{-5}$ $\Omega \cdot cm^2$.

According to at least one embodiment, the intermediate layer is a first insulation layer, which prevents direct current flow between the first mirror layer and the semiconductor layer sequence in the entire region of the side walls. The first insulation layer thus forms an electrical insulation between the semiconductor layer sequence and the conductive material of the first contact element in the region of the side walls. For example, the first insulation layer has a silicon oxide, such as $SiO_2$, or a silicon nitride, such as SiN, or consists thereof. The thickness of the first insulation layer is, for example, between 50 nm including and 200 nm including. In particular, the first mirror layer is electrically insulated from the first layer, of the second layer and of the active layer.

According to at least one embodiment, the second contact element is formed to be contiguous, in particular simply connected. Preferably, the second contact element thus has no interruptions, such as holes.

According to at least one embodiment, the active layer is formed contiguous, in particular simply connected, in a region, which is the projection of the second contact element on the active layer. Second charge carriers preferably pass into the second layer over the entire lateral extent of the second contact element and recombine with the first charge carriers in the entire said region of the active layer. Electromagnetic radiation is then generated in this region. In turn, the shape and size of this light-generating region of the active layer substantially defines the size and shape of the image point perceived by an observer when looking onto the first main side. Small dimensional deviations and size deviations are attributable, for example, to the lateral current expansion within the semiconductor layer sequence.

According to at least one embodiment, the optoelectronic semiconductor component comprises a plurality of second contact elements, which are arranged next to one another and spaced apart from one another in a lateral direction, parallel to the second main side. The second contact elements may be formed as the previously described and hereinafter described second contact element. The second contact elements are preferably arranged in a matrix-like manner on the second main side, for example, in meshes of a grid network. In the region of the grid lines, the second contact elements are then spaced apart from one another. In particular, an image point as described above is uniquely assigned to each of the second contact elements. Accordingly, the image points may be arranged in a matrix-like manner on the first main side.

According to at least one embodiment, the second contact elements are controlled individually and independently of one another during operation, so that the image points can be illuminated independently of one another. This means that the contact elements can be supplied with current or voltage individually and independently of one another.

According to at least one embodiment, the recess or a plurality of recesses described above are arranged in the region between two adjacent second contact elements.

According to at least one embodiment, the semiconductor component has a plurality of first contact elements, as previously described and hereinafter described, having the associated recesses. The first contact elements may be controllable individually and independently of one another. Alternatively, the first contact elements may only be actuated jointly, for example, via a common switch.

According to at least one embodiment, at least one image point is assigned a plurality of first contact elements which redundantly contact the respective image point. If, for example, the recesses are formed as plated-through holes, the recesses with the associated first contact elements may be arranged all around the second contact element belonging to the image point. In this case, the image point is in redundant contact means that first charge carriers are injected into the semiconductor layer sequence via the plurality of first contact elements during operation, which at least partially recombine with the second charge carriers from the image point assigned to the second contact element.

According to at least one embodiment, at least one of the first contact elements is arranged laterally adjacent to a plurality of adjacent image points and is formed for simultaneous contacting of the plurality of adjacent image points. In particular, the recess of the first contact element is then arranged in a region between two adjacent second contact elements or associated image points. The first charge carriers from the first contact element then recombine partially with second charge carriers of the second contact element of an image point during operation and partially with second charge carriers of the second contact element of an adjacent image point.

According to at least one embodiment, the image points are arranged in meshes of a grid network, wherein one or more recesses of one or more contact elements are arranged on one or more nodes of the grid network. If, for example, the second contact elements are formed in a square or rectangular manner in a plan view of the second main side, the recesses are arranged, for example, at the corners of the second contact elements.

According to at least one embodiment, the recess is formed as a trench. In a plan view of the second main side, the trench and the injection element each form a continuous track, which completely surrounds the second contact element. In particular, the contrast ratio of adjacent image points may be increased by means of this trench-shaped configuration of the recess.

According to at least one embodiment, the semiconductor component comprises a plurality of second contact elements, around which a respective trench is arranged. The trenches around the individual second contact elements are preferably formed in a continuous manner, so that they form together a contiguous trench. Preferably, the trenches form a grid network around the second contact elements. In turn, the second contact elements can then be arranged in the meshes of the grid network.

According to at least one embodiment, a single continuous first contact element is formed in the contiguous trenches around the second contact elements, which simultaneously contacts a plurality of image points during operation. The continuous first contact element follows, for example, the grid structure of the contiguous trenches.

According to at least one embodiment, the injection element protrudes beyond the second main side in the direction away from the first main side. The injection element is preferably formed in one piece. In particular, the injection element extends over the entire vertical extent or almost over the entire vertical extent of the recess. In the lateral direction, the first intermediate layer, the first mirror layer and the injection element are superimposed on each other.

According to at least one embodiment, a second insulation layer is arranged between the injection element and the first mirror layer in the region of the side walls of the recess, which, for example, electrically insulates the first mirror layer and the injection element from one another. The second insulation layer may have the same or different materials as the above-mentioned first insulation layer. The second insulation layer may be in direct contact with both the injection element and the first mirror layer in the region of the side walls. Alternatively, a second insulation layer is dispensed with and the first mirror layer is in direct contact with the injection element in the region of the side walls.

According to at least one embodiment, the injection element is applied as a layer to the bottom surface of the recess. In this case, the mirror layer is introduced into the recess as a mirror filling material, for example, and completely or at least partially fills the region between the injection element and the second main side. In this case, second charge carriers which are injected into the first contact element pass, via the reflective filling material or the first mirror layer into the injection element and from there into the first layer. The layer thickness of the injection element on the bottom surface is, for example, at least 5 nm or at least 20 nm or at least 50 nm or at least 100 nm and/or at most 500 nm or at most 200 nm or at most 100 nm.

According to at least one embodiment, a carrier having switches for controlling the second contact elements is arranged on the second main side. The carrier may be, for example, an active matrix element with transistors as switches, such as thin-film transistors. For example, a second contact element is uniquely assigned to each switch. The second contact elements may be controlled individually and independently of one another via the switches.

According to at least one embodiment, the first main side is a radiation surface for coupling in or coupling out electromagnetic radiation from or into the semiconductor component. In particular, no carrier stabilizing the component is therefore applied to the first main side. Only a thin encapsulation layer may be applied to the first main side. The radiation surface is preferably designed to be flat along the entire lateral extent of the semiconductor component. In particular, no notch in the form of a trench is introduced between two adjacent image points on the first main side.

Further a method for producing an optoelectronic semiconductor component is provided. The method is suitable, for example, for producing a semiconductor component as described above. All features disclosed in connection with the semiconductor component are therefore also disclosed for the method and vice versa.

According to at least one embodiment, the method comprises a step A), in which a semiconductor layer sequence is provided having a first main side, a first layer on the first main side, an active layer on the first layer, a second layer on the active layer and a second main side on the second layer.

According to at least one embodiment, a plurality of second contact elements is applied to the second main side in a step B), wherein the second contact elements are arranged next to one another and spaced apart from one another in the lateral direction, parallel to a main extension direction of the active layer.

According to at least one embodiment, in a step C) recesses in the form of holes or trenches are introduced into the semiconductor layer sequence from the second main side. The recesses penetrate the second layer and the active layer completely and open into the first layer. Furthermore, the recesses are arranged laterally next to the second contact elements in a plan view of the second main side.

According to at least one embodiment, the method comprises a step D), in which a first intermediate layer is applied to side walls of the recesses extending transversely to the active layer. In this case, the first intermediate layer directly adjoins the semiconductor layer sequence.

According to at least one embodiment, the method comprises a step E), in which a first mirror layer is applied directly to the first intermediate layer in the region of the side walls.

According to at least one embodiment, in a step F) an injection element is applied to the bottom surfaces of the recesses directly adjoining the first layer. After the application, no further metallic element is arranged between the injection element and the bottom surface. The injection element and the mirror layer have different material compositions.

According to at least one embodiment, steps A) to F) are carried out in the specified sequence as separate method steps. In particular, steps A) to D) may be carried out in the specified sequence.

According to at least one embodiment, the first intermediate layer is applied over the whole area to the bottom surfaces and the side walls of the recesses. The inner sides of the recesses are then initially completely covered by the first intermediate layer. In a subsequent step, the bottom surfaces can in turn be freed from the first intermediate layer by a dry chemical etching back process. The etching back of the first intermediate layer preferably takes place in a self-aligning manner, so that a use of a lithography mask is not necessary. The directed dry chemical etching process has the consequence that the first intermediate layer is not or hardly detached from the vertically extending side walls, whereas the etching rate or etching rate on the laterally extending bottom surfaces is substantially higher.

Alternatively, the removal of the first intermediate layer from the bottom surface can also be dispensed with. In the further production method, the first intermediate layer is then removed neither from the bottom surface nor from the side walls. This can be the case in particular if the first intermediate layer is a contact layer as described above.

According to at least one embodiment, in step E) the first mirror layer is applied over the whole area to the bottom surfaces and the side walls of the recesses. The inner sides of the recesses are then initially completely covered by the first mirror layer. Subsequently, the bottom surface can be freed from the first mirror layer by a wet chemical or dry chemical etching back process. The etching back of the first mirror layer preferably likewise takes place in a self-aligning manner and is carried out without using a lithography mask. Wet chemical etching back of the first mirror layer is particularly suitable, when the first mirror layer on the side walls of the recesses is covered by a protective layer, for example, a second insulation layer as described below.

According to at least one embodiment, after the application of the first mirror layer and before the etching back of the first mirror layer, a second insulation layer is applied over the whole area to the first mirror layer in the region of the bottom surfaces and of the side walls of the recesses. Subsequently, the first mirror layer can be freed from the second insulation layer in the region of the bottom surfaces by a dry chemical etching back process. The second insulation layer is also preferably etched back in a self-aligning manner, so that the use of a lithography mask is not necessary.

According to at least one embodiment, step F) is carried out before step E). In the step F) the injection element is formed as a layer on the bottom surfaces of the recesses by means of an anisotropic deposition method. Subsequently, in step E), the recess is filled with a reflective filling material, which then forms the first mirror layer.

BRIEF DESCRIPTION OF THE DRAWINGS

In the following, an optoelectronic semiconductor component described here and a method for producing an optoelectronic semiconductor component described here will be explained in more detail with reference to drawings on the basis of exemplary embodiments. The same references numerals indicate the same elements in the individual figures. However, no scale relationships are shown, but individual elements may be exaggerated for better understanding.

In the figures:

FIGS. 1A to 1K show different positions in an exemplary embodiment of a production method for an optoelectronic semiconductor component;

FIGS. 1L to 1N show plan views of exemplary embodiments of the optoelectronic semiconductor component;

FIGS. 7A to 7D show different positions in a further exemplary embodiment of the production method for the optoelectronic semiconductor component.

DETAILED DESCRIPTION OF ILLUSTRATIVE EMBODIMENTS

Figure 1D:
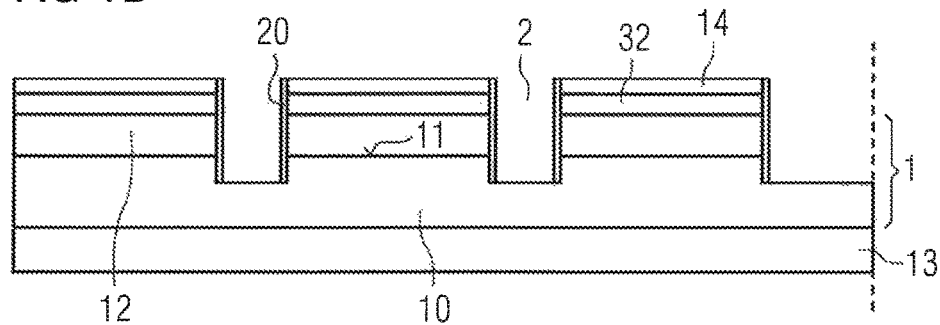

FIG. 1A shows a first position of a method for producing an optoelectronic semiconductor component. In this case, a semiconductor layer sequence 1 is applied directly to a substrate 13, for example, a growth substrate of the semiconductor layer sequence 1. The semiconductor layer sequence 1 has a first main side facing the substrate 13 and a second main side facing away from the substrate 13. A first layer 10, an active layer 11 and a second layer 12 are arranged on the substrate 13 and applied in the specified sequence between the first main side and the second main side. Furthermore, a second contact layer 320 and a first passivation layer 14 arranged thereon are applied to the second main side of the semiconductor layer sequence 1.

The semiconductor layer sequence 1 is based, for example, on GaN, the substrate 13 is, for example, a sapphire or GaN growth substrate. The second contact layer 320 is formed from Ag, for example. The first passivation layer 14 may comprise or consist of an insulating material such as $SiO_2$ or SiN.

In the position of the method shown in FIG. 1B, the second contact layer 320 and the passivation layer 14 arranged thereon are lithographically patterned with the aid of a mask. The structuring results in second contact elements 32, which are arranged in the lateral direction, parallel to the main extension direction of the active layer and are arranged next to one another and spaced apart from one another on the second main side.

In the position shown in FIG. 1C, the semiconductor layer sequence 1 is patterned with the aid of the same mask. In this case, recesses 2 are introduced into the semiconductor layer sequence 1, which extend from the second main side completely through the second layer 12 and the active layer 11 and open into the first layer 10. The recesses 2 are formed in the interspaces between the adjacent second contact elements 32. The recesses 2 may be cylindrical through-holes or trenches, which each have side surfaces extending transversely with respect to the active layer 11 and bottom surfaces extending substantially parallel to the active layer 11.

In the position of FIG. 1D, a first intermediate layer 20 in the form of a first insulation layer 20 is applied completely to the side walls of the recesses 2, such as an $SiO_2$ layer or a SiN layer. The first insulation layer 20 may be applied, for example, by initially conformal deposition of the first insulation layer 20 onto the second main side of the semiconductor layer sequence 1. In this case, the first insulation layer 20 is placed in a form-fitting manner on the side walls and on the bottom surfaces of the recesses 2. Subsequently, a dry chemical etching back process may be carried out, in which the etching rate is greater on surfaces parallel to the second main side than on surfaces perpendicular to the second main side. As a result, the first insulation layer 20 is completely removed on the bottom surfaces of the recesses 2, whereas the first insulation layer 20 remains on the side walls of the recesses 2. In the case of such a self-aligning etching-back process, the use of a mask, such as a lithography mask, is not necessary.

Figure 1E:
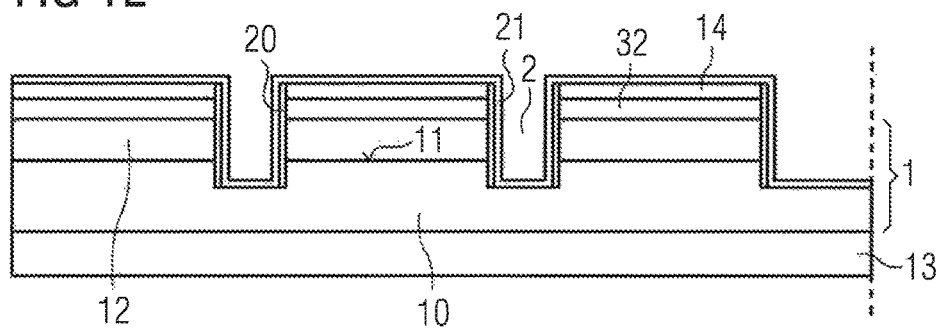

In the position illustrated in FIG. 1E, a first mirror layer 21, for example, an Ag layer, is applied from the second main side to the semiconductor layer sequence 1. The first mirror layer 21 covers both the bottom surfaces and the side walls of the recesses 2 completely and in a form-fitting manner.

Figure 1F:
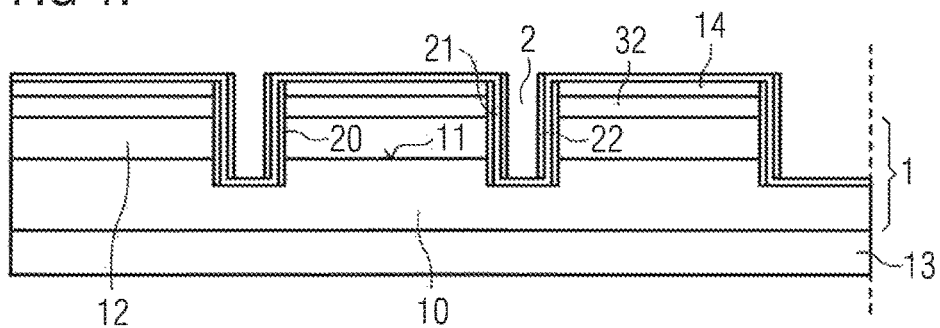

In the position of FIG. 1F, a second insulation layer 22 is applied to the first mirror layer 21 in the region of the side walls of the recess 2, for example, an $SiO_2$ layer or SiN layer. The application of the second insulation layer 22 may be carried out in the same way as the application of the first insulation layer 20 by initially conformal deposition and a subsequent etching back process. In this way, it is achieved that the first mirror layer 21, which is arranged in the region of the bottom surfaces of the recesses 2, is free of the second insulation layer 22.

In the position of FIG. 1G, the bottom surfaces of the recesses 2 are also freed from the first mirror layer 21. A dry chemical or wet chemical etching method may be used for removing the first mirror layer 21 from the bottom surfaces. In the case of a wet chemical, in particular isotropic etching method, the second insulation layer 22 acts on the side walls as a protective layer, so that the first mirror layer 21 is not affected at the side walls. The second insulation layer thus acts virtually as a mask for the etching process on the first mirror layer 21. The use of an additional lithography mask is also not necessary for etching away the first mirror layer 21 from the bottom surface.

In the position of FIG. 1H, the recesses 2 are filled with an injection element 23 in the form of a metallic material, such as Al, Ti or Au. On the second main side, the injection element 23 also covers regions around the recess 2. In the cross-sectional view of FIG. 1H, the injection element 23 is T-shaped. Overall, first contact elements 31 are formed by the at least partial filling with the injection element 23, which completely fill the recesses 2. In the region of the bottom surfaces, the injection element 23 is in direct contact with the first layer 10 of the semiconductor layer sequence 1. Alternatively, a transparent conductive material may also be applied to the bottom surface, such as ZnO or ITO, which is then in direct contact with the first layer 10 and the injection element 23.

In the position shown in FIG. 1I, a second passivation layer 15 is applied to the second main side, which covers the first contact elements 31 and the second contact elements 32 completely and in a form-fitting manner. The second passivation layer 15 may comprise or consist of the same material as the first passivation layer 14.

Figure 1J:
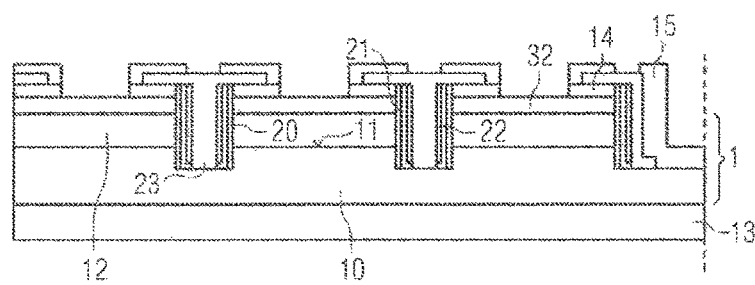

In FIG. 1J, the first 14 and the second passivation layer 15 are patterned by means of a lithography process, that the first 31 and second contact elements 32 are at least partially exposed. In particular, the second contact elements 32 are exposed in regions which do not overlap with the first contact elements 31.

Figure 1K:
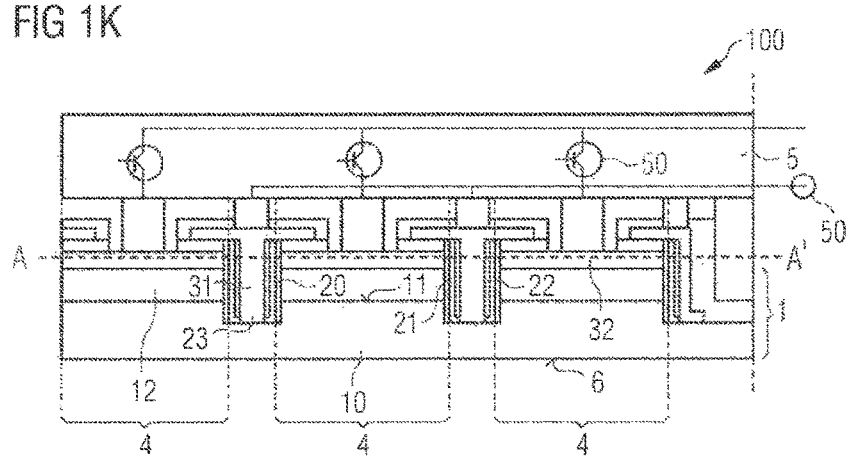

In the position of FIG. 1K, a carrier 5 with switches 50 is shown, which is applied to the second main side of the semiconductor layer sequence 1. In this case, the switches 50 are mechanically and electrically conductively connected via a conductive material, such as a solder metal or a conductive adhesive, to the second contact elements 32. A second contact element 32 is uniquely assigned to each switch 50. Via the switches 50, the individual second contact elements 32 may be contacted or energized individually and independently of one another. Furthermore, the first contact elements 31 are assigned a common switch 50, which jointly contacts and supplies current to all the first contact elements 31.

In FIG. 1K, it can also be seen that the substrate 13 is removed from the first main side of the semiconductor layer sequence 1. The first main side of the semiconductor layer sequence 1 forms a radiation surface 6 for radiation which is generated in the active layer 11. The radiation surface 6 extends continuously over a plurality of first 31 and second contact elements 32.

In addition, it can be seen in FIG. 1K that an image point 4 is uniquely assigned to each second contact element 32. During operation, the image points 4 are illuminated at a view onto the radiation surface 6, depending on which second contact element 32 is supplied with current. The image points 4 are defined substantially by the projection of the second contact elements 32 onto the radiation surface 6. The shape, size and position of the image points 4 thus substantially result from the shape, size and position of the second contact elements 32.

Figure 1L:
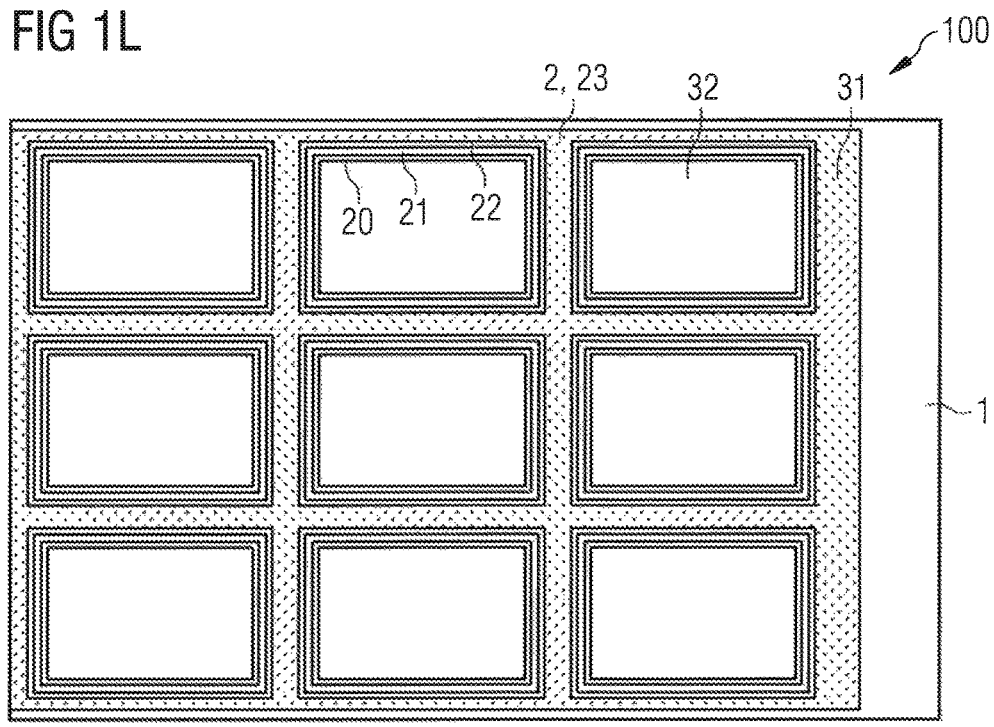

FIG. 1L shows an exemplary embodiment of a semiconductor device 100 described here in a plan view of the second main side of the semiconductor layer sequence 1. The individual second contact elements 32, which are arranged in a matrix-like pattern, can be seen. The first contact elements 31 form a single continuous first contact element 31. The recesses 2 form a continuous trench 2, which is arranged in the form of a grid around the second contact elements 32. The first contact element 31 forms a common mating contact to the plurality of second contact elements 32.

Figure 1M:
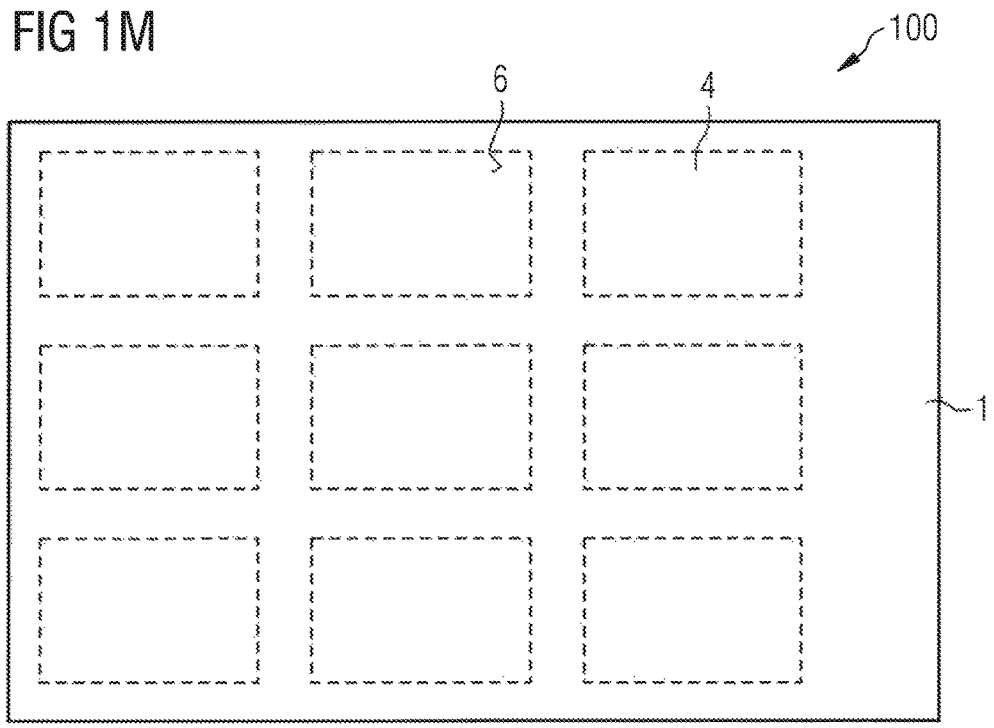

FIG. 1M shows a plan view of the first main side or the radiation surface 6 of the semiconductor component 100. The contours of the individual image points 4, which are uniquely assigned to the second contact elements 32, are represented in dashed lines, and their contours substantially correspond to the contours of the second contact elements 32. The individual image points 4 may be controlled individually and independently of one another during operation, so that the radiation surface 6 shown in FIG. 1M represents a pixelated luminous surface.

In the exemplary embodiment of FIG. 1N, as in FIG. 1L, a plan view of the second main side of the semiconductor layer sequence 1 is shown. In contrast to FIG. IL, the recesses 2 are not arranged here as trenches 2 around the second contact elements 32, but are formed as holes 2 in the semiconductor layer sequence 1. The holes 2 are in each case attached at crossing points of a grid network around the second contact elements 32. In particular, the first contact elements 31 arranged in the holes 2 are thus in the form of plated-through holes, for example, cylindrical through-holes, which are formed in the semiconductor layer sequence 1. A plurality of first contact elements 31 is associated with each second contact element 32. However, at least two second contact elements 32 are also assigned to each first contact element 31.

Figure 2A:
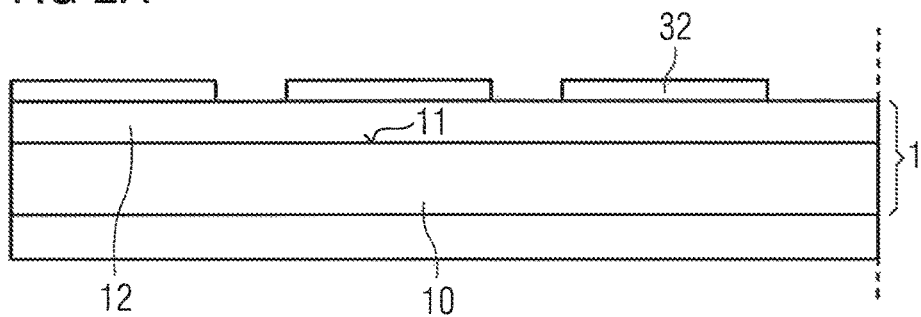
FIGS. 2A to 2C, 3A to 3B, 4A to 4C and 5A to 5C show positions in a further exemplary embodiment of the production method for the optoelectronic semiconductor component.
Figure 2B:
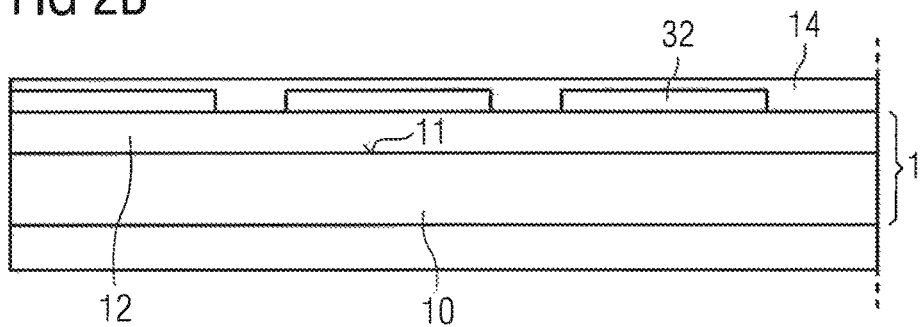
Figure 2C:
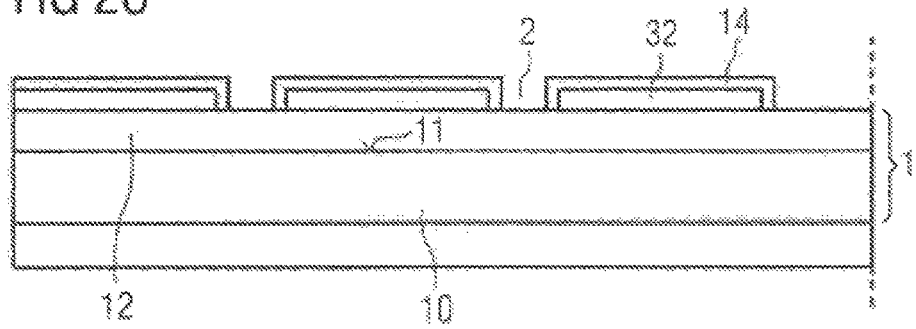

FIGS. 2A to 2C show alternative method steps to those of FIGS. 1A and 1B.

In FIG. 2A, a plurality of second contact elements 32 are applied to the second main side of the semiconductor layer sequence 1, which are spaced apart from one another. In contrast to the position of FIG. 1A, at this point in time no first passivation layer 14 is applied to the second contact elements 32.

The first passivation layer 14 is only applied to the second contact elements 32 in the position of FIG. 2B. In this case, the first passivation layer 14 completely covers the second contact elements 32 and also fills the intermediate regions on the second main side between adjacent second contact elements 32.

The first passivation layer 14 can then be patterned by means of a pixel-fine lithography method by means of a mask, so that the semiconductor layer sequence 1 is exposed in the region between two adjacent second contact elements 32. The result is shown in FIG. 2C. In contrast to FIG. 1B, these method steps also cover the second contact elements 32 with the first passivation layer 14 on side surfaces extending transversely to the second main side. This offers the advantage that the second contact elements 32 are better protected, but has the disadvantage, that a greater area consumption occurs in the region between the second contact elements 32 and that more process steps are required.

Figure 3A:
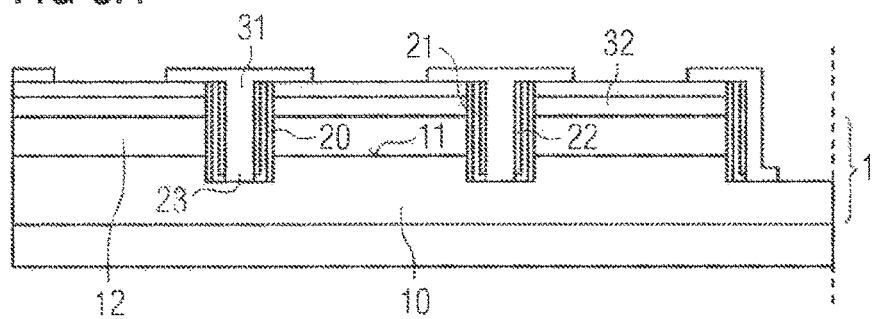
Figure 3B:
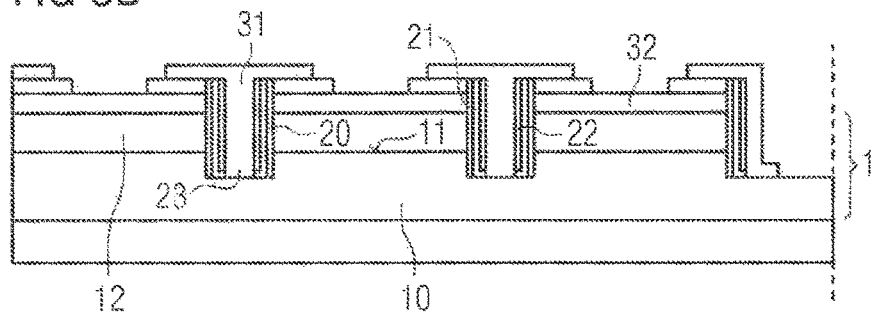

FIGS. 3A to 3B show alternative method steps for the method steps of FIGS. 1H to 1J. In this case, FIG. 3A initially corresponds to FIG. 1H.

Unlike in the exemplary embodiment of FIGS. 1H to 1J, after the first contact elements 31 have been formed, no second passivation layer 15 is applied to the second main side of the semiconductor layer sequence 1. Instead, as illustrated in FIG. 3B, the first passivation layer 14 is patterned directly photolithographically, wherein the first 31 and second contact elements 32 are at least partially exposed. A second passivation layer 15 is not used at all. This has the advantage over the method illustrated in FIG. 1 that fewer process steps are necessary.

Figure 4A:
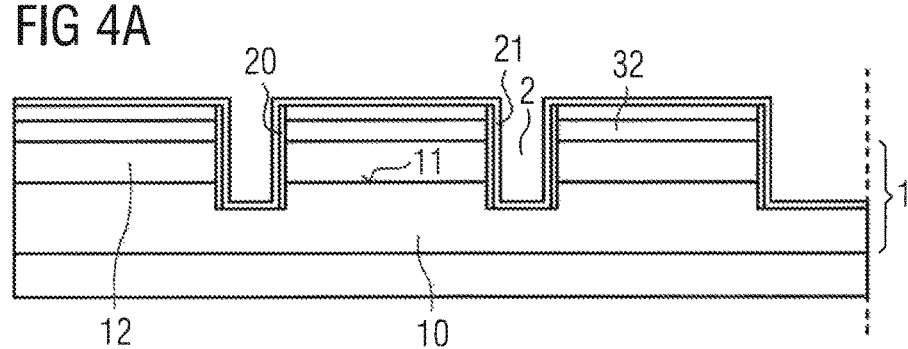
Figure 4B:
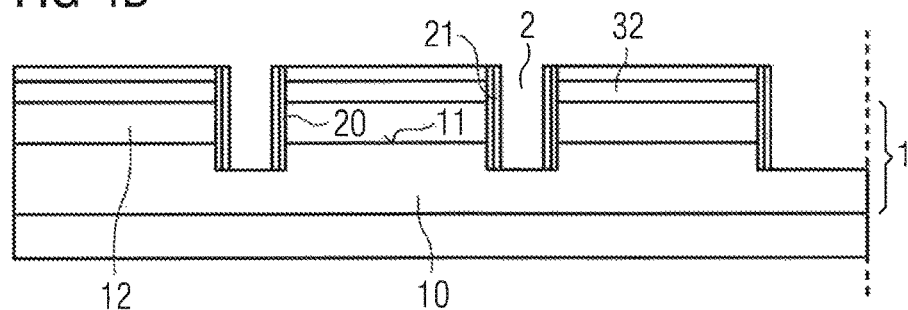
Figure 4C:
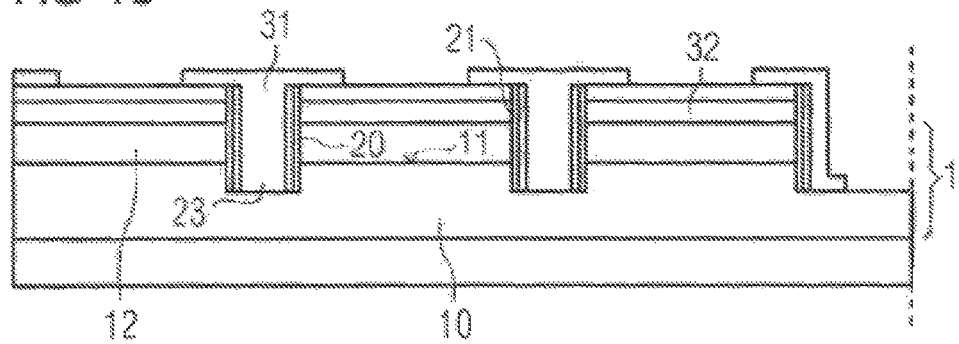

FIGS. 4A to 4C show alternative method steps for the method steps of FIGS. 1E to 1H. In this case, FIG. 4A initially corresponds to FIG. 1E.

In contrast to FIGS. 1E to 1H, in order to remove the first mirror layer 21 from the bottom surfaces of the recess 2, a second insulation layer 22 is not used. Instead, as illustrated in FIG. 4B, the first mirror layer 21 is etched back from the bottom surfaces of the recesses 2 by means of an anisotropic etching back process, such as, for example, a dry chemical etching back process. Due to the anisotropy of the etching back process, only the bottom surfaces of the recesses 2 are exposed, whereas the first mirror layer 21 remains on the side walls of the recesses 2.

FIG. 4C shows how the recesses 2 are filled with the injection element 23, as a result of which the first contact elements 31 are produced. In addition, the injection element 23 is in direct contact with the first layer 10 at the bottom surfaces. In addition, in the exemplary embodiment of FIG. 4C, the injection element 23 is also in direct electrical contact with the first mirror layer 21.

Figure 5A:
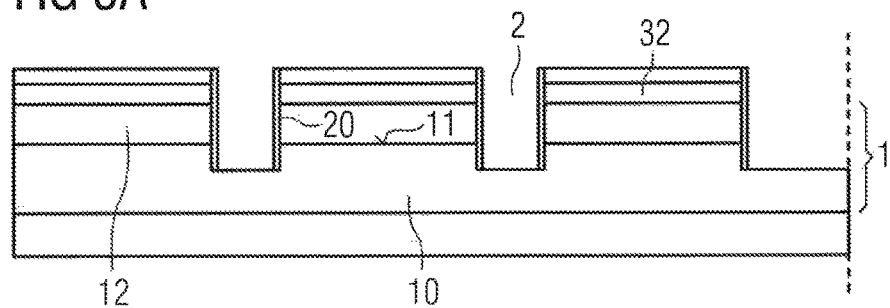
Figure 5B:
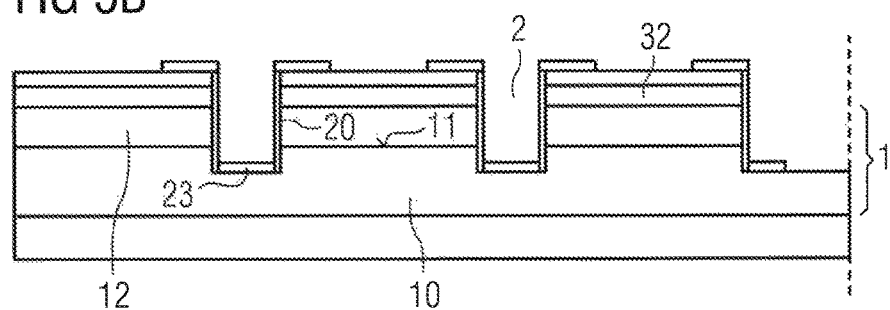
Figure 5C:
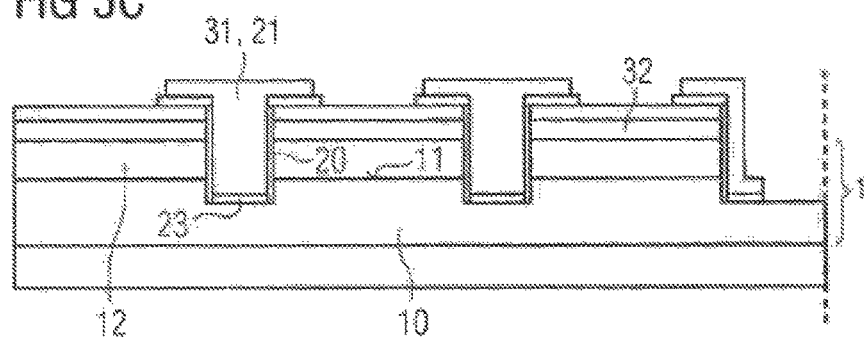

In FIGS. 5A to 5C, positions of method steps are shown, which can be carried out as an alternative to the method steps of FIGS. 1D to 1H.

FIG. 5A corresponds to the FIG. 1D described above. This means that the side walls of the recesses 2 are already covered with the first insulation layer 20, in contrast, the bottom surfaces of the recesses 2 are freed from the first insulation layer 20.

FIG. 5B shows how, the metallic injection element 23 is applied as a layer to the bottom surfaces by means of an anisotropic deposition method, for example, physical vapor deposition, PVD for short, for example, directly to the bottom surface of the recesses 2. This can be done, for example, with the aid of a photolithographic mask. By using the anisotropic deposition method, the side walls of the recesses 2 remain free of the injection element 23.

A position in the method is shown in FIG. 5C, in which a reflecting metallic filling material 21 is subsequently introduced into the recesses 2. The filling material 21 completely fills the recesses 2 and projects beyond the recesses 2 in the direction away from the second main side. The reflective filling material 21 simultaneously forms the first mirror layer 21. In contrast to the previous exemplary embodiments, the first contact elements 31 are now formed predominantly by the first mirror layer 21 instead of the injection elements 23.

Figure 6A:
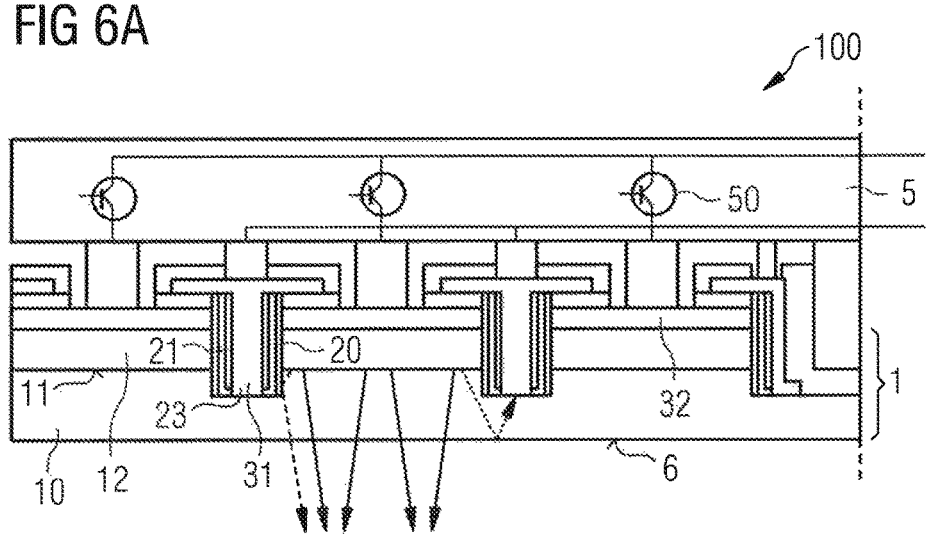
FIG. 6A shows an exemplary embodiment of the optoelectronic semiconductor component in a side view.

FIG. 6A shows a side view of an exemplary embodiment of the optoelectronic semiconductor component 100, which corresponds to the exemplary embodiment of FIG. 1K. In addition, FIG. 6A shows some light paths, represented as arrows, of electromagnetic rays generated in the active layer 11.

The solid arrows represent beams within an image point 4, which are coupled out of the semiconductor component 100 directly from the active layer 11 via the radiation surface 6.

The dashed arrow shows a light path, in which a beam is reflected at the side wall of a recess and is then coupled out via the radiation surface. In this case, the beam is reflected particularly effectively by the highly reflective first mirror layer 21.

The dotted arrow shows a light path in which the beam from the active layer 11 first impinges on the radiation surface 6, but is partially or completely reflected back there due to Fresnel reflection or total reflection. There is the risk that this beam reaches an adjacent image point 4 and thus the contrast ratio between the pixels 4 is reduced.

In the present exemplary embodiment, however, the beam first impinges on the bottom surface of the recess 2, impinging on the injection element 23 instead of the first mirror layer 21. The injection element 23 is preferably absorbent or poorly reflective, so that the light is absorbed at the bottom surface. This reduces the optical cross-talk of adjacent image points 4 and increases the contrast ratio for the observer.

Figure 6B:
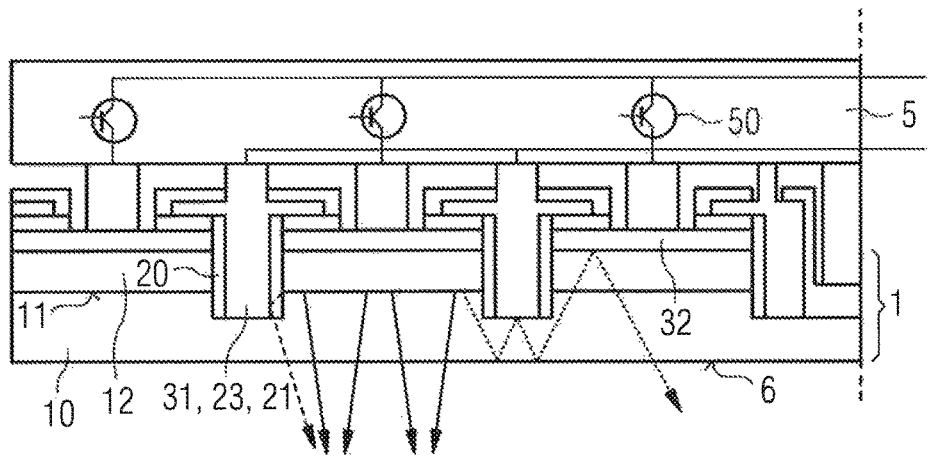
FIG. 6B shows a modification of the optoelectronic semiconductor component in a side view.

In contrast, FIG. 6B shows a modification of the semiconductor component, in which the injection element 23 and the mirror layer 21 are formed from the same material. As can be seen from FIG. 6B, the beam is reflected at the bottom surface of the recesses 2, resulting in cross-talk of adjacent image points 4 and a reduced contrast ratio for the observer.

FIGS. 7A to 7D show various positions in a further exemplary embodiment of the production method. The position of FIG. 7A pursues, for example, the position from FIG. 1C.

In FIG. 7A, a photomask 40 having openings in the regions of the recesses 2 is additionally applied to the passivation layer 14. Overall, the openings are larger than the lateral extensions of the recesses 2. As shown in FIG. 7A, the first intermediate layer 20 is applied to the photomask 40 as a continuous layer and is introduced into the recesses 2, for example, by means of an undirected process such as sputtering. In this case, the first intermediate layer 20 completely covers both the bottom surfaces and the side walls of the recesses 2.

In contrast to the previous exemplary embodiments, the first intermediate layer 20 is not a first insulation layer 20 but a contact layer 20, which has a low contact resistance to the first layer 10 of the semiconductor layer sequence 1, in which the contact resistance to the second layer 12 of the semiconductor layer sequence 1 is large. For example, the semiconductor layer sequence 1 is based on GaN, the first layer 10 is then, for example, an n-GaN layer, the second layer 12 comprises, for example, a p-GaN layer. The material of the contact layer 20 is, for example, ZnO.

In all of the preceding exemplary embodiments, the first intermediate layer 20 is a first insulation layer 20, however, the first insulation layer 20 can also be exchanged in each case with such a contact layer 20.

In the position of FIG. 7B, a metallic layer is applied to the contact layer 20 by means of a directed process, such as vapor deposition. This metallic layer forms the injection elements 23 in the region of the bottom surfaces of the recesses 2. The contact layer 20 can conduct current between the injection element 23 and the first layer 10. The directed application of the metallic layer ensures that only the laterally extending surfaces, in particular the bottom surfaces, are covered. The vertically extending surfaces, in particular the side walls, are not covered or only slightly covered by the metallic material of the injection elements 23.

In turn, in the position of FIG. 7C, a metallic first mirror layer 21 is applied by means of an undirected or isotropic method, so that both the side walls and the bottom surfaces are covered by the first mirror layer 21.

In contrast to the example in the exemplary embodiment of FIG. 5C, the first mirror layer 21 does not completely fill the recess 2, but only partially and contours the bottom surfaces and side walls of the recesses 2. In this case, a part of the recesses 2 remains unfilled. Such a partial filling of the recesses 2 can also be selected in all previous exemplary embodiments.

FIG. 7D shows a position, in which the photomask 40 is detached with the layers located thereon. Subsequently, for example, the method steps described in connection with FIGS. 1I to 1K can be carried out, in order to finish the semiconductor component 100.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An optoelectronic semiconductor component comprising:
   a semiconductor layer sequence comprising:
      a first main side;
      a first layer arranged at the first main side;
      an active layer disposed on the first layer;
      a second layer disposed on the active layer; and
      a second main side arranged at the second layer;
   a first contact element arranged on the second main side filling a recess in the semiconductor layer sequence, wherein the recess extends from the second main side completely through the second layer and the active layer and opens out into the first layer; and
   a second contact element arranged on the second main side, the second contact element being arranged laterally next to the recess in a plan view of the second main side,
   wherein the first contact element comprises a transparent intermediate layer, a metallic mirror layer and a metallic injection element,
   wherein the intermediate layer is arranged on side walls of the recess running transversely to the active layer and is in direct contact with the semiconductor layer sequence,
   wherein the mirror layer is arranged directly at the intermediate layer in a region of the side walls,
   wherein the injection element is placed on a bottom surface of the recess directly adjoining the first layer and no further metallic element is arranged between the injection element and the bottom surface,
   wherein, during operation, the intermediate layer prevents a direct current flow between the second layer and the first contact element,
   wherein a contour of the second contact element forms a shape, size and position of an image point of the semiconductor component which is illuminated when looking onto the first main side during operation, and
   wherein the injection element and the mirror layer have different material compositions.

2. The optoelectronic semiconductor component according to claim 1,
   wherein the side walls of the recess are covered at least 80% with the mirror layer,
   wherein a reflectivity of the mirror layer at an average wavelength emitted by the active layer is at least 80%, and
   wherein a reflectivity of the injection element at the average wavelength emitted by the active layer is at most 50%.

3. The optoelectronic semiconductor component according to claim 1, wherein the injection element directly adjoins the first layer in a region of the bottom surface or in a region of the bottom surface, a transparent layer is arranged between the injection element and the first layer, which is directly connected to the injection element and the first layer and has a transparency at an average wavelength emitted by the active layer of at least 80%.

4. The optoelectronic semiconductor component according to claim 1, wherein the intermediate layer is a first insulation layer configured to prevent direct current flow between the mirror layer and the semiconductor layer sequence in the region of the side walls.

5. The optoelectronic semiconductor component according to claim 1,
   wherein the intermediate layer is a contact layer,
   wherein the contact layer in a region of the first layer provides an electrical contact between the first layer and the mirror layer,
   wherein the contact layer in a region of the second layer acts in an electrically insulating manner between the mirror layer and the second layer, and
   wherein the contact layer is additionally arranged between the bottom surface and the injection element.

6. The optoelectronic semiconductor component according to claim 1,
   wherein the second contact element is continuous, and
   wherein the active layer is contiguous in a region defined by a projection of the second contact element on the active layer.

7. The optoelectronic semiconductor component according to claim 1, further comprising a plurality of second contact elements, which are arranged next to one another and spaced apart from one another in a lateral direction, parallel to the second main side, wherein each of the second contact elements is uniquely assigned to an image point, wherein the second contact elements are controlled individually and independently of one another during operation, so that the image point can be illuminated independently of one another, and wherein the recess is arranged in a region between two adjacent second contact elements.

8. The optoelectronic semiconductor component according to claim 1, wherein at least one image point is assigned a plurality of first contact elements which redundantly contact the respective image point.

9. The optoelectronic semiconductor component according to claim 1, wherein at least one of the first contact elements is arranged laterally adjacent to a plurality of adjacent image points and is formed to simultaneously contact the plurality of adjacent pixels.

10. The optoelectronic semiconductor component according to claim 1, wherein the image points are arranged in meshes of a grid network, and wherein one or more recesses of one or more contact elements are arranged on one or more nodes of the grid network.

11. The optoelectronic semiconductor component according to claim 1,
wherein the recess is a trench, and
wherein, in a plan view of the second main side, the trench and the injection element each form a continuous track, which completely surrounds the second contact element.

12. The optoelectronic semiconductor component according to claim 11,
wherein the trenches are connected around individual second contact elements and form a grid around the second contact elements, and
wherein, in the trenches, a single continuous first contact element is formed, which simultaneously contacts a plurality of image points during operation.

13. The optoelectronic semiconductor component according to claim 1, wherein a second insulation layer is arranged in a region of the side walls of the recess between the injection element and the mirror layer.

14. The optoelectronic semiconductor component according to claim 1,
wherein the injection element is a layer at the bottom surface of the recess, and
wherein the mirror layer is a reflecting filling material in the recess and completely or at least partially fills a region between the injection element and the second main side.

15. A method for producing an optoelectronic semiconductor component, the method comprising:
A) providing a semiconductor layer sequence having a first main side, a first layer on the first main side, an active layer on the first layer, a second layer on the active layer and a second main side on the second layer;
B) applying a plurality of second contact elements to the second main side, wherein the second contact elements are arranged next to one another and spaced apart from one another in a lateral direction, parallel to a main extension direction of the active layer;
C) introducing recesses in form of holes or trenches from the second main side into the semiconductor layer sequence, wherein the recesses completely penetrate the second layer and the active layer and open into the first layer, and wherein the recesses are arranged laterally next to the second contact elements in a plan view of the second main side;
D) applying a intermediate layer to side walls of the recesses running transversely to the active layer so that the intermediate layer directly adjoins the semiconductor layer sequence;
E) directly applying a metallic mirror layer to the intermediate layer in a region of the side walls; and
F) applying a metallic injection element to bottom surfaces of the recesses directly adjoining the first layer, wherein subsequently no further metallic element is arranged between the injection element and the bottom surfaces, and wherein the injection element and the mirror layer have different material compositions.

16. The method according to claim 15, wherein applying the intermediate layer to the side walls comprises:
applying the intermediate layer to the bottom surfaces and the side walls of the recesses; and
subsequently removing the intermediate layer from the bottom surfaces by a dry chemical etching back process,
wherein the etching back process of the intermediate layer is self-aligning and is carried out without using a lithography mask.

17. The method according to claim 15, wherein applying the intermediate layer to the side walls comprises applying the intermediate layer to the bottom surfaces and the side walls of the recesses and wherein the intermediate layer is removed neither from the bottom surface nor from the side walls in a further production step.

18. The method according to claim 15, wherein directly applying the metallic mirror layer to the intermediate layer comprises:
applying the mirror layer to the bottom surfaces and the side walls of the recesses; and
subsequently removing the mirror layer from the bottom surfaces by a wet chemical or dry chemical etching back process,
wherein the etching back process of the mirror layer is self-aligning and is carried out without using a lithography mask.

19. The method according to claim 18, further comprising applying a second insulation layer to the mirror layer in an area of the bottom surfaces and the side walls of the recesses; and
subsequently removing the second insulation layer from the mirror layer in regions of the bottom surfaces by a dry chemical etching back process,
wherein the etching back process of the second insulation layer is self-aligning and is carried out without using a lithography mask.

20. The method according to claim 15,
wherein step F) is carried out before step E),
wherein, in step F), the injection element is formed as a layer on the bottom surfaces of the recesses by an anisotropic deposition method,
wherein, in step E), the recesses are filled with a reflective material, which then forms the mirror layer.

21. An optoelectronic semiconductor component comprising:
a semiconductor layer sequence comprising:
a first main side;
a first layer arranged at the first main side;
an active layer disposed on the first layer;
a second layer disposed on the active layer; and
a second main side arranged at the second layer;
a first contact element arranged on the second main side, the first contact element fills a recess in the semiconductor layer sequence, wherein the recess extends from the second main side completely through the second layer and the active layer and opens out into the first layer; and
a plurality of second contact elements applied to the second main side parallel to the second main side and spaced apart from one another in a lateral direction, the second contact elements are arranged laterally next to the recess in a plan view of the second main side, wherein the first contact element comprises a transparent intermediate layer, a metallic mirror layer and a metallic injection element, wherein the intermediate layer is arranged on side walls of the recess running transversely to the active layer and is in direct contact with the semiconductor layer sequence, wherein the mirror layer is applied directly to the intermediate layer in a region of the side walls, wherein the injection element is placed on a bottom surface of the recess directly adjoining the first layer and no further metallic element is arranged between the injection element and the bottom surface, wherein, during operation, the intermediate layer prevents a direct current flow between the second layer and the first contact element, wherein a contour of the second contact element forms a shape, size and position of an image point of the semiconductor component which is illuminated when looking onto the first main side during operation, wherein the injection element and the mirror layer have different material compositions, and wherein each of the second contact elements is uniquely assigned to an image point.

* * * * *